(12) United States Patent
Esquius Morote

(10) Patent No.: US 12,255,615 B2
(45) Date of Patent: Mar. 18, 2025

(54) ELECTRONIC COMPONENT

(71) Applicant: RF360 Singapore Pte. Ltd., Republic Plaza (SG)

(72) Inventor: Marc Esquius Morote, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 853 days.

(21) Appl. No.: 17/294,595

(22) PCT Filed: Dec. 13, 2019

(86) PCT No.: PCT/EP2019/085064
§ 371 (c)(1),
(2) Date: May 17, 2021

(87) PCT Pub. No.: WO2020/126902
PCT Pub. Date: Jun. 25, 2020

(65) Prior Publication Data
US 2021/0408998 A1  Dec. 30, 2021

(30) Foreign Application Priority Data
Dec. 18, 2018 (DE) ...................... 10 2018 132 695.5

(51) Int. Cl.
*H03H 9/145* (2006.01)
*H03H 9/25* (2006.01)
*H03H 9/64* (2006.01)

(52) U.S. Cl.
CPC .............. *H03H 9/145* (2013.01); *H03H 9/25* (2013.01); *H03H 9/64* (2013.01)

(58) Field of Classification Search
CPC .... H03H 9/14541; H03H 9/6483; H03H 9/64; H03H 9/25; H03H 9/145
See application file for complete search history.

(56) References Cited

U.S. PATENT DOCUMENTS 7,893,597 B2 * 2/2011 Nishimura ......... H03H 9/14541
310/313 B
2002/0036549 A1  3/2002 Matsuda et al.
(Continued)

FOREIGN PATENT DOCUMENTS

| CN | 1592099 A | 3/2005 |
|---|---|---|
| CN | 109004914 A | 12/2018 |

(Continued)

OTHER PUBLICATIONS

International Search Report and Written Opinion—PCT/EP2019/085064—ISA/EPO—Mar. 27, 2020.

*Primary Examiner* — J. San Martin
(74) *Attorney, Agent, or Firm* — Polsinelli

(57) ABSTRACT

An electronic component comprises a piezoelectric substrate (1) and an interdigital capacitor (2) on top of the piezoelectric substrate. The interdigital capacitor comprises two electrodes (21, 22), each of the electrodes comprising a plurality of fingers (23). The fingers each comprise an associated first metal layer (231) and at least some of the fingers comprise an associated second metal layer (232) on top of the first metal layer. For each finger comprising a first and a second metal layer a width of the finger in the region of the associated first metal layer is larger than the width of the finger in the region of the associated second metal layer.

14 Claims, 4 Drawing Sheets

(56) References Cited

U.S. PATENT DOCUMENTS

Figure 1A:
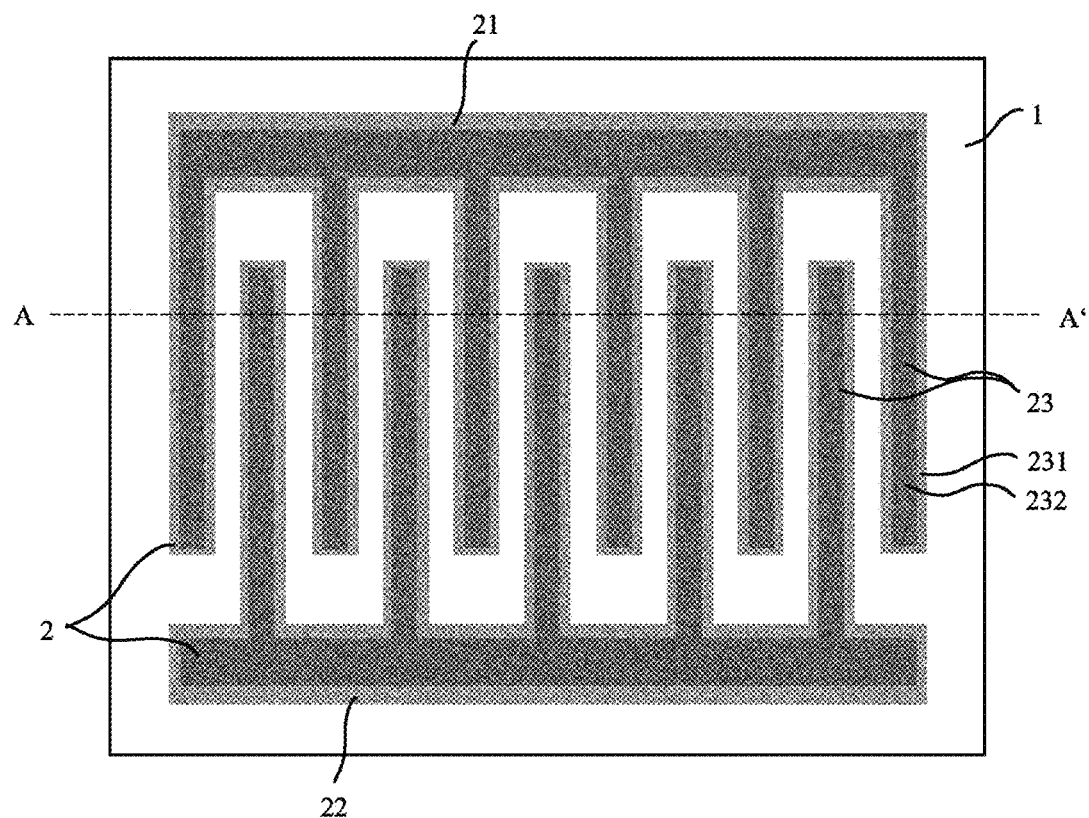

| | | | |
|---|---|---|---|
| 2003/0146674 A1* | 8/2003 | Jacot | H03H 3/08 |
| | | | 310/313 R |
| 2004/0070313 A1* | 4/2004 | Furukawa | H03H 9/14541 |
| | | | 310/313 R |
| 2006/0076851 A1* | 4/2006 | Fujimoto | H03H 9/02818 |
| | | | 310/313 R |
| 2012/0133246 A1* | 5/2012 | Yaoi | H03H 9/131 |
| | | | 310/313 C |
| 2017/0104470 A1 | 4/2017 | Koelle et al. | |
| 2017/0250335 A1* | 8/2017 | Taniguchi | H10N 30/877 |
| 2018/0041187 A1* | 2/2018 | Yashiro | H03H 9/02574 |
| 2018/0097501 A1* | 4/2018 | Kikuchi | H03H 9/14541 |
| 2018/0109236 A1* | 4/2018 | Konoma | H03H 9/02559 |
| 2019/0199321 A1 | 6/2019 | Nosaka | |

FOREIGN PATENT DOCUMENTS

| | | | | |
|---|---|---|---|---|
| CN | 216216809 U | * | 4/2022 | H03H 3/08 |
| EP | 2773039 A1 | | 9/2014 | |
| JP | H06232678 A | | 8/1994 | |
| JP | 2004023593 A | | 1/2004 | |
| JP | 2018050135 A | | 3/2018 | |
| WO | 2018051846 A1 | | 3/2018 | |

\* cited by examiner

ELECTRONIC COMPONENT

An electronic component is specified.

One object to be achieved is to specify an electronic component with a very stable performance.

This object is achieved, inter alia, with the subject-matter of the independent claim. Advantageous embodiments and further developments are the subject-matter of the dependent claims.

According to at least one embodiment, the electronic component comprises a piezoelectric substrate and an interdigital capacitor on top of the piezoelectric substrate. The interdigital capacitor comprises two electrodes, each of the electrodes comprising a plurality of fingers. The fingers each comprise an associated first metal layer and at least some of the fingers comprise an associated second metal layer on top of the first metal layer. For each finger comprising a first and a second metal layer a width of the finger in the region of the associated first metal layer is larger than a width of the finger in the region of the associated second metal layer.

The invention is inter alia based on the idea that interdigital capacitors on a piezo electric substrate might produce unwanted surface acoustic waves (SAW) when provided with an alternating electric voltage. By providing some of the fingers with the second metal layer, which has a smaller width than the first metal layer, the mass load along the surface of the piezoelectric substrate is changed. This hinders the excitation of oscillations of the fingers compared to the case where only a first metal layer for all fingers is used. Consequently, the excitation of surface acoustic waves is suppressed. Moreover, with the additional second metal layer, the ohmic losses are reduced so that the quality factor Q is improved.

The electronic component is preferably an electronic chip. The electronic component can comprise one or several interdigital capacitors as specified above and as specified in the following.

The piezoelectric substrate comprises or consists of a piezoelectric material, such as lithium tantalite, lithium niobate or quartz. The piezoelectric substrate may be self-supporting. Particularly, the piezoelectric material can be provided as a bulk material.

In electronic components, capacitors are used, for example, for impedance matching. The interdigital capacitor is a capacitor in which the two electrodes each comprise fingers, which are arranged in a comb-like manner. The fingers of an electrode are electrically connected to each other by a busbar. For example, each electrode of the interdigital capacitor comprises at least two fingers or at least four fingers.

Both electrodes are located on a top side of the piezoelectric substrate. Each finger has a length, measured along a main extension direction of the finger, and a width, measured perpendicularly to the main extension direction of the finger. Both the length and the width are measured parallel to the top side of the piezoelectric substrate. The fingers preferably run parallel or essentially parallel to each other.

For each finger, the length of the finger is larger than the width of the finger. For example, the length of each finger is at least two times or at least five times or at least ten times larger than its width. Here and in the following the terms "length", "width" and "thickness" preferably correspond to mean values.

The fingers of the first electrode and the fingers of the second electrode interdigitate but are electrically isolated from one another. In other words, the fingers of the first electrode and the fingers of the second electrode alternate along a direction perpendicular to the main extension direction of the fingers. During normal operation, the electrodes of the interdigital capacitor preferably lie on different potentials and are, for example, provided with an alternating voltage.

The fingers each comprise an associated first metal layer. For each finger the associated first metal layer is preferably formed contiguously and/or in one piece. The first metal layer is preferably in direct contact with the top side of the piezoelectric substrate. Particularly, the first metal layer is in direct contact to the piezoelectric material of the piezoelectric substrate. For example, the first metal layer comprises or consists of copper, titanium or aluminum. The first metal layers of the fingers of an electrode can be contiguous and/or can be formed in one piece.

For each finger the width in the region of the associated first metal layer is, for example, at least 1 µm or at least 5 µm or at least 10 µm. Alternatively or additionally, the width of the fingers in the region of the associated first metal layer is in each case at most 100 µm or at most 50 µm or at most 30 µm. For each finger, the width in the region of the first metal layer is preferably constant within the limits of production tolerance. The width of the fingers in the region of the first metal layer is preferably the same for all fingers within the limits of production tolerance. The first metal layer in each case preferably extends over the entire length of the associated finger.

A minimum distance between two adjacent fingers of the interdigital capacitor in each case is preferably in the same order of magnitude as the width of the fingers in the region of the first metal layer. For example, the distance is at least 25% of the width and at most 500% of the width of the fingers in the region of the first metal layer.

At least some of the fingers, preferably all of the fingers of both electrodes, comprise a second metal layer on top of the first metal layer. The second metal layer might be in direct contact with the first metal layer. The first metal layer is arranged between the second metal layer and the piezoelectric substrate. The second metal layer is applied on top of the first metal layer and might be in direct contact with the first metal layer. The second metal layer may comprise copper, titanium or aluminum or consist of one or several of these materials. The second metal layer of each finger might be formed contiguous and/or in one piece.

In the region of the associated second metal layer, the fingers have a smaller width than in the region of the first metal layer. In other words this means that in each finger the width of the associated second metal layer is smaller than the width of the associated first metal layer. For example, in the region of the second metal layer the width of the fingers is at most 80% or at most 75% or at most 50% of the width in the region of the first metal layer. Alternatively or additionally the width of the fingers in the region of the second metal layer is at least 10% of the width in the region of the first metal layer. Preferably, the width of the fingers in the region of the second metal layer is constant within the limits of production tolerance.

In other words, the width of the fingers comprising a first and a second metal layer follows a step-like function. The fingers of the interdigital capacitor preferably comprise at most two metal layers.

The second metal layer in each case preferably extends over the entire length of the associated finger. In other words this means that in each case the length of the finger in the region of the first metal layer may be the same as in the region of the second metal layer.

According to at least one embodiment, for each finger comprising a first and a second metal layer, a thickness of the associated first metal layer is smaller than a thickness of the associated second metal layer. For example, the thickness of the associated second metal layer is in each case at least two times or at least five times or at least ten times larger than the thickness of the first metal layer. The thickness of the first metal layer is for example between 10 nm and 1 µm inclusive, preferably between 5 nm and 200 nm inclusive. The thicknesses of the first metal layer and the second metal layer are in each case preferably constant within the limits of production tolerance. The thickness is measured perpendicularly to the top side of the substrate.

A large thickness of the second metal layer results in a large mass load which effectively suppresses oscillations and surface acoustic waves.

According to at least one embodiment, for all fingers comprising a first and a second metal layer, the associated second metal layer and the associated first metal layer are arranged identically with respect to each other. This means, that in each finger with a first metal layer and a second metal layer the dimensions of the first metal layer and the second metal layer as well as the orientation and position of the second metal layer with respect to the first metal layer are the same within the limits of production tolerance. Such an interdigital capacitor can be produced very easily, because the same masks can be used for the production of all fingers.

According to at least one embodiment, in different fingers the associated second metal layer and the associated first metal layer are arranged differently in a predetermined manner with respect to each other. This means, for example, the position and/or the orientation of the second metal layer with respect to the first metal layer is different for different fingers. The dimensions of the first and the second metal layer might be the same for all fingers.

In this embodiment the mass load of the fingers is aperiodical along a direction perpendicular to the main extension direction of the fingers, which even more effectively suppresses oscillations and surface acoustic waves.

According to at least one embodiment the electronic component further comprises a surface-acoustic-wave-resonator (SAW resonator) with an interdigital transducer, wherein the interdigital transducer comprises two electrodes, each with a plurality of fingers. Particularly, the electronic component is a surface acoustic wave filter (SAW filter). For example, the electronic component is a RF filter, particularly for a mobile communication system, such as a smartphone. The electronic component is for example configured for Tx applications. Preferably, the electronic component comprises several SAW resonators as specified above or in the following.

The interdigital transducer can be designed similarly to the interdigital capacitor. Particularly, the fingers of the electrodes are also arranged in a comb-like manner and interdigitate. The fingers of the interdigital transducer preferably all have the same dimensions within the limits of productions tolerance.

In contrast to the interdigital capacitor, however, the interdigital transducer should oscillate during normal operation and thus should produce surface acoustic waves. Therefore, the fingers of the interdigital transducer preferably each have a constant width within the limits of production tolerance. Particularly, the fingers of the interdigital transducer preferably comprise only a first metal layer but not a second metal layer.

The SAW resonator can further comprise reflection structures, between which the interdigital transducer is arranged.

The reflection structures help confine acoustic energy in the SAW resonator. The reflection structures prevent acoustic energy from leaving the resonator's acoustic wave in the direction of propagation of the acoustic wave. Further, it is possible that the reflection structures are arranged in the vicinity of the electrodes of the interdigital transducer and are connected to a ground potential.

It is possible that the piezoelectric substrate is a carrier of the electronic component. It is also possible that the piezoelectric substrate is a piezoelectric layer and that the SAW resonator is a TF-SAW resonator (TF-SAW=thin film-surface-acoustic-wave). TF-SAW resonators are characterized in that the piezoelectric material is not provided as a bulk material, as in the case of a conventional SAW resonator, but in that the piezoelectric material is provided as a thin film. A thin film material is characterized in that it is provided utilizing wafer bonding or thin film material deposition techniques, for example sputtering, physical vapor deposition, chemical vapor deposition, molecular beam epitaxy and the like.

According to at least one embodiment the interdigital transducer is arranged on top of the piezoelectric substrate. This means that the interdigital transducer and the interdigital capacitor are arranged on the same piezoelectric substrate, preferably on the same top side of the piezoelectric substrate. The piezoelectric substrate is preferably formed contiguous and/or in one piece.

According to at least one embodiment the interdigital transducer is electrically connected to the interdigital capacitor. For example, conductor tracks on top of the piezoelectric substrate electrically connect the interdigital transducer and the interdigital capacitor.

According to at least one embodiment a pitch between two adjacent fingers of the interdigital capacitor is larger than a pitch between two adjacent fingers of the interdigital transducer. Particularly, the pitch between two adjacent fingers of the interdigital capacitor is at least two times or at least five times or at least ten times or at least 20 times the pitch between two adjacent fingers of the interdigital transducer. Additionally or alternatively, the pitch between two fingers of the interdigital capacitor is at most 100 times larger or at most 60 times larger or at most 50 times larger than the pitch between two fingers of the interdigital transducer. For example, the pitch between two adjacent fingers of the interdigital transducer is at most 1 µm or at most 0.5 µm and/or at least 0.1 µm or at least 0.3 µm. The pitch between two adjacent fingers of the interdigital capacitor is for example at least 10 µm or at least 15 µm and/or at most 50 µm or at most 20 µm.

The pitch between two adjacent fingers of the interdigital capacitor/interdigital transducer is in each case the distance between centers, such as centers of gravity or centers of symmetry, of two adjacent fingers. Two adjacent fingers are usually fingers of different electrodes.

According to at least one embodiment, a width of the fingers of the interdigital capacitor is at least as large as a width of the fingers of the interdigital transducer. Here, the width of the fingers of the interdigital capacitor is in each case means the width of the associated first metal layer. For example the width of the fingers of the interdigital capacitor is at least two times or at least five times or at least ten times or at least 20 times the width of the fingers of the interdigital transducer.

In SAW filters, usually interdigital capacitors are used which have a smaller pitch than the pitch of the interdigital transducer of the SAW resonator. If the interdigital capacitor has a larger pitch, unwanted acoustic waves above the main resonance of the SAW resonator are often produced, which would degrade the filter performance. However, with the present invention, in which a second metal layer is used in at least some of the fingers of the interdigital capacitor, the pitch between the fingers of the interdigital capacitor can be chosen larger than the pitch of the interdigital transducer. Surface acoustic waves are suppressed by the additional mass load due to the second metal layer.

This is particularly advantageous if the main frequency of the SAW resonator is above 3 GHz, as in this case the pitch of the interdigital transducer is already very small.

Without the second metal layer, the pitch of the fingers of the interdigital capacitor would have to be even smaller. Accordingly, the dimensions of the fingers of the interdigital capacitor would have to be chosen to be very small, close to the process limits of current manufacturing techniques. However, even if such small pitches and such small dimensions could be realized, the interdigital capacitor would not be feasible for most applications, because the capacitance fluctuation due to process variations would be prohibitive (variations>±10%). Moreover, power handling capabilities of such capacitors would also be very limited and not suitable for, for example, Tx applications.

As the fingers of the interdigital capacitor of the present invention can be chosen to be much larger, they are almost unaffected by process variations and thus provide a stable capacitance value. Moreover, they are able to handle a lot of power.

According to at least one embodiment, the fingers of the interdigital capacitor run transversely, preferably perpendicularly, to the fingers of the interdigital transducer. This means, the main extension directions of the fingers of the interdigital capacitor are orientated transversely or perpendicularly to the main extension direction of the fingers of the interdigital transducer. In particular, the fingers of the interdigital capacitor run parallel or essentially parallel to the main propagation direction of the SAW resonator's main mode.

Also by rotating the fingers of the interdigital capacitor with respect to the fingers of the interdigital transducer acoustic wave excitation due to the interdigital capacitor can be reduced.

According to at least one embodiment the surface acoustic wave resonator has a resonance frequency of at least 3 GHz, for example between 3 GHz and 6 GHz inclusive, or of at least 6 GHz.

According to at least one embodiment the fingers of the interdigital transducer have the same thickness as the first metal layer. "Same thickness" means the same thickness within the limits of production tolerance. Preferably the fingers of the interdigital transducer are made from the same material as the first metal layer. For example, the first metal layer of the fingers of the interdigital capacitor and the fingers of the interdigital transducer are produced in a common production process. For example, they are produced in a common sputtering or layer deposition or etching or lithography process.

According to at least one embodiment, the capacitance of the interdigital capacitor is at most 2 pF or at most 1 pF.

According to at least one embodiment, each of the fingers of the interdigital capacitor comprises a first and a second metal layer.

According to at least one embodiment the electronic component is a surface-acoustic-wave filter.

Hereinafter, an electronic component is described with reference to the drawings by means of exemplary embodiments. Here, like reference numerals indicate like elements in the figures. However, the size ratios involved are not to scale. Individual elements may rather be illustrated with an exaggerated size for a better understanding.

Figure 2:
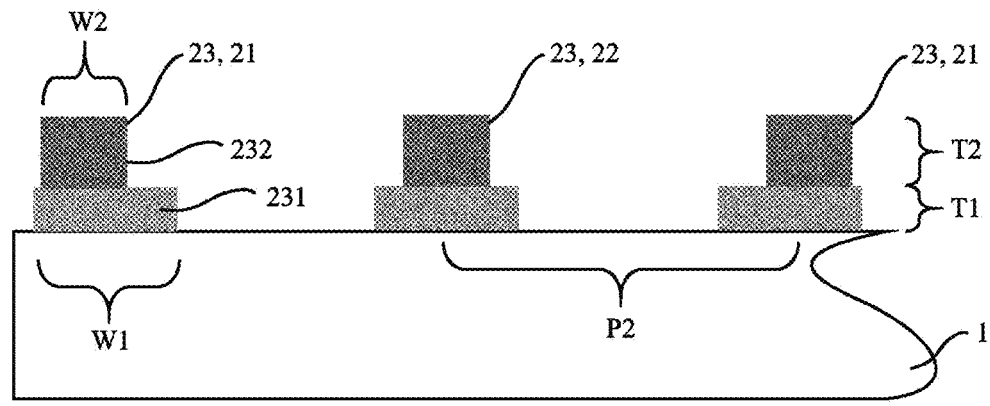
Figure 3:
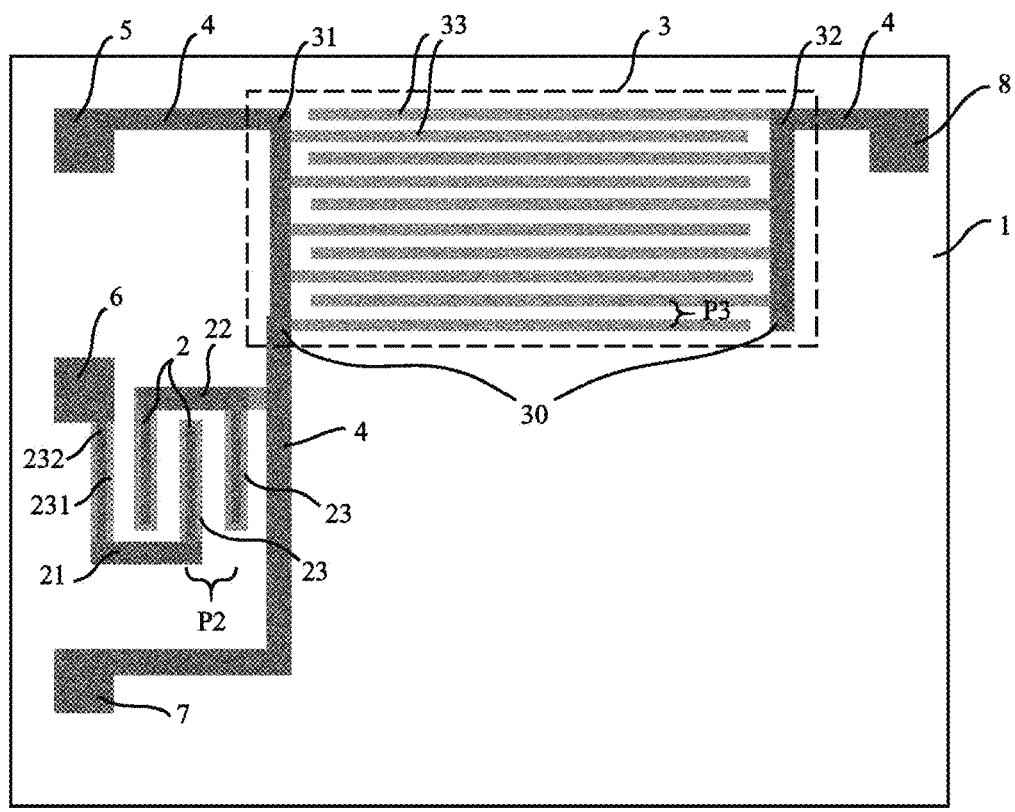
Figure 4A:
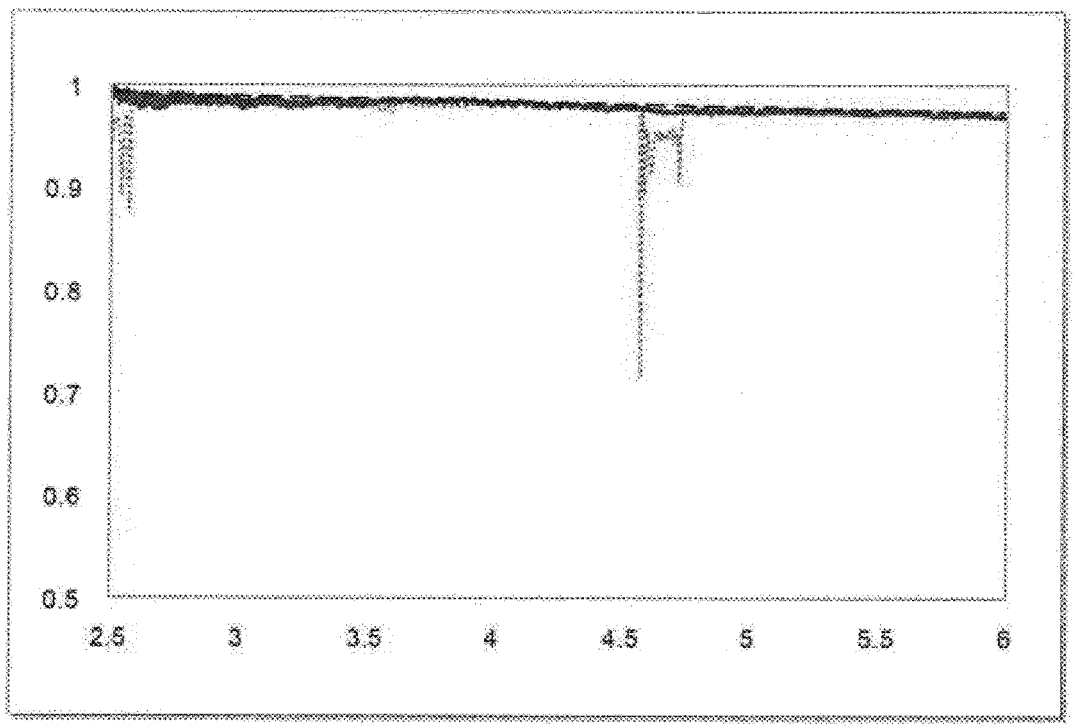
Figure 4B:
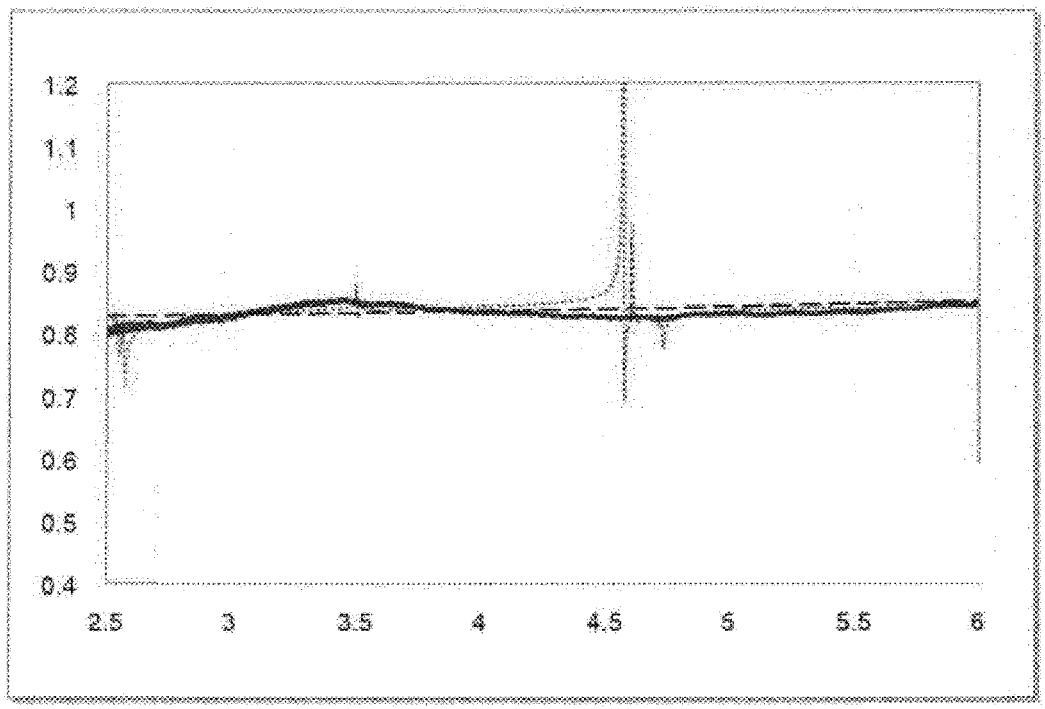
Figure 4C:
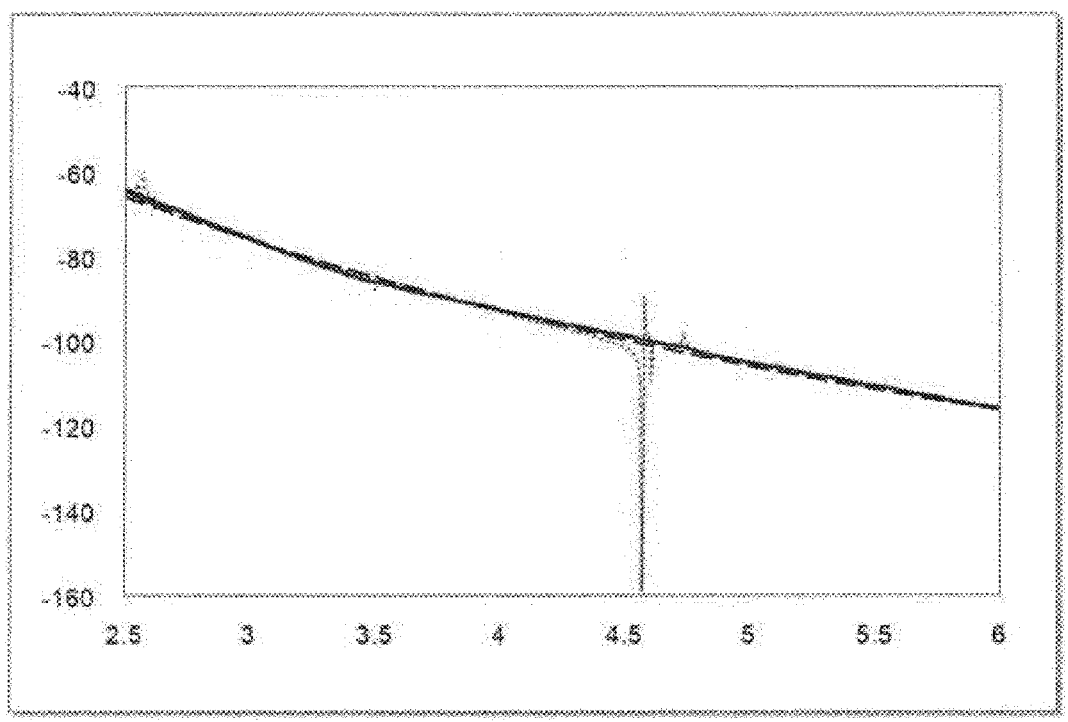

As shown in:

FIGS. 1A to 3 different exemplary embodiments of the electronic component in different views, FIGS. 4A to 4C performance measurements of an exemplary embodiment of the electronic component.

FIG. 1A shows a first exemplary embodiment of an electronic component. The electronic component comprises a piezoelectric substrate 1 with a top side. FIG. 1 is a top view on to the top side of the piezoelectric substrate 1. The piezoelectric substrate 1 is for example a lithium tantalite substrate.

An interdigital capacitor 2 is arranged on the top side of the piezoelectric substrate 1. The interdigital capacitor 2 comprises a first electrode 21 and a second electrode 22.

Both electrodes 21, 22 comprise a plurality of fingers 23. The fingers 23 of each electrode 21, 22 are arranged in a comb-like manner and are electrically connected to each other via a busbar, extending transversely to the fingers 23. The fingers 23 of both electrodes 21, 22 interdigitate and are electrically isolated from one another. The main extension directions of the fingers 23 run parallel or essentially parallel to each other. Lengths of the fingers 23, which are in each case measured parallel to the main extension direction, are larger than widths of the fingers 23, measured perpendicularly to the main extension direction. Both the length and the width are measured parallel to the top side of the piezoelectric substrate 1.

Moreover, one can see from FIG. 1A that the fingers 23 each comprise a first metal layer 231 and a second metal layer 232. The first metal layer 231 is located between the second metal layer 232 and the piezoelectric substrate 1. The widths of the fingers 23 in the region of the second metal layer 232 are constant in each case within the limits of production tolerance. The same is true for the width in the region of the first metal layer 231. The width of the fingers 23 in the region of the second metal layer 232 is smaller than in the region of the first metal layer 231.

The first metal layer 231 and the second metal layer 232 are, for example, formed from different materials. For example, the first metal layer 231 is Ti and the second metal layer is Cu. However, it is also possible that both metal layers 231, 232 are formed from the same material.

Figure 1B:
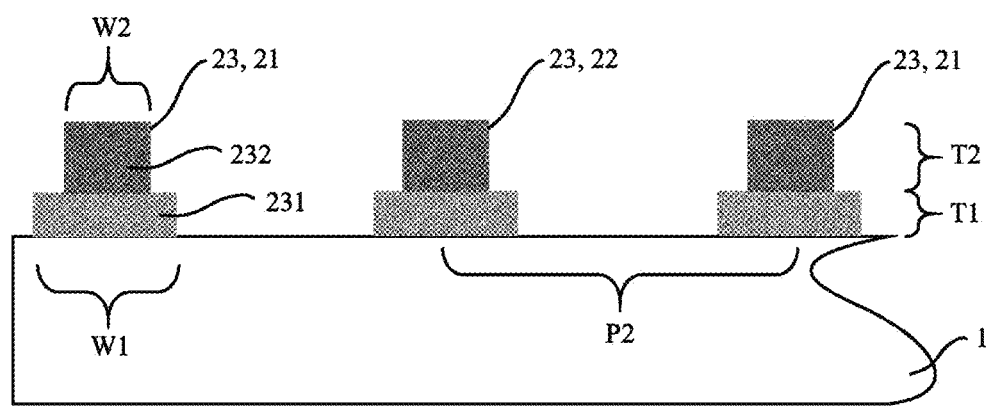

FIG. 1B shows a cross-sectional view of FIG. 1A along the line AA'. For the sake of simplicity only a part of the electronic component with three fingers 23 is shown. It becomes clear again that the widths W1 of the fingers 23 in the region of the first metal layer 231 are larger than the widths W2 of the fingers 23 in the region of the second metal layer 232 in each finger 23. For example, the widths W1 in the region of the first metal layer 231 are three times the widths W2 in the region of the second metal layer 232. For example, the width in the region of first metal layer 231 is about 10 µm.

A thickness T2 of the second metal layer 232, measured perpendicularly to the top side of the piezoelectric substrate 1, is larger than a thickness T1 of the first metal layer 231. For example, the thickness T2 of the second metal layer 232 is about ten times the thickness T1 of the first metal layer 231. The thickness T1 of the first metal layer is for example about 100 nm.

The pitch P2 between two adjacent fingers 23 is for example at least 10 µm. The capacitance of the interdigital capacitor 2 is preferably smaller than 1 pF.

With the interdigital capacitor as shown in FIG. 1 the appearance of surfaces acoustic waves when energizing the electrodes 21, 22 with alternating electric voltage is reduced. This is particularly due to the fact that the second metal layer 232 brings additional mass load, which suppresses oscillations of the fingers 23. Consequently, such an interdigital capacitor 2 is particularly suitable for an electronic component in the form of an electronic filter.

In FIG. 1B the second metal layers 232 of the fingers 23 always have the same dimensions. The same is true for the first metal layers 231. Moreover the first 231 and the second metal layers 232 are always arranged in the same way with respect to each other. Consequently, the structure of the fingers 23 periodically repeats when going along a direction perpendicular to the main extension direction of the fingers 23.

In FIG. 2 a second exemplary embodiment of an electronic component is shown, which is almost identical to the electronic component of FIG. 1. However, in FIG. 2 the arrangement of the first metal layer 231 and the second metal layer 232 in different fingers 23 is different. The first metal layer 231 of the fingers 23 is arranged periodically when going along the direction perpendicular to the main extension direction of the fingers 23. However, the second metal layer 232 is arranged on different positions in the different fingers 23. In the finger 23 that is the farthest to the left the metal layer 232 is shifted to the left side of the first metal layer 231. In the next finger 23, the second metal layer 232 is arranged in the center of the first metal layer 231. One finger 23 further to the right the second metal layer 232 is shifted to the right side of the first metal layer 231.

Consequently, when traversing along the direction perpendicular to the main extension of direction of the fingers 23, there is no periodicity in the structure of the fingers 23. An excitation of surface acoustic waves is even more suppressed in this case.

FIG. 3 shows a third exemplary embodiment of an electronic component in top view on to the top side of the piezoelectric substrate 1. The electronic component again comprises an interdigital capacitor 2, which is basically designed like the interdigital capacitor of FIG. 1. Only the number of fingers 23 is reduced in FIG. 3.

Moreover, in FIG. 3 the electronic component comprises a surface-acoustic-wave (SAW) resonator 3. The SAW resonator 3 comprises an interdigital transducer 30 having a first electrode 31 and a second electrode 32, each with a plurality of fingers 33. Also the fingers 33 of the different electrodes 31, 32 interdigitate and run basically parallel to each other. The interdigital transducer 3 is disposed on the same piezoelectric substrate 1 as the interdigital capacitor 2.

The first electrodes 31 is electrically connected to an input terminal 5 and an output terminal 7 via a conductor track 4. The second electrode 32 is connected to a ground terminal 8. When applying an alternating voltage to the input terminal 5 so that the electrodes 31, 32 lie on different potentials, surfaces acoustic waves are produced in the piezoelectric substrate 1 within the SAW resonator 3. These surface acoustic waves propagate in a direction perpendicular to the main extension direction of the fingers 33. If the pitch P3 of the fingers 33 corresponds to half of the wavelength of the surface acoustic waves, the SAW resonator 3 is operated in resonance. By tapping the voltage with the output terminal 7, a frequency filter is realized. Particularly, the electronic component of FIG. 3 is a surface-acoustic-wave (SAW) filter, for example a radio frequency filter, such as a filter for mobile communication devices.

The resonance frequency of the SAW resonator 3 of FIG. 3 is for example more than 3 GHz. In this case, the pitch P3 is for example between 0.3 µm and 0.5 µm.

In FIG. 3 the interdigital capacitor 2 is electrically connected in parallel to the surface acoustic wave resonator 30. For this purpose, the second electrode 22 of the interdigital capacitor 2 is connected to the first electrode 31 of the interdigital transducer 30. The first electrode 21 of the interdigital capacitor 2 is connected to a ground terminal 6.

As can be seen from FIG. 3 the pitch P2 between two adjacent fingers 23 of the interdigital capacitor 2 is larger than the pitch P3 between adjacent fingers 33 of the interdigital transducer 30. Usually, one would avoid such a configuration, because the interdigital capacitor 2 might then also produce surface acoustic waves above the main resonance frequency, which would degrade the filter performance of the electronic component. Therefore, usually, the pitch P2 in the interdigital capacitor 2 is chosen to be smaller than the pitch P3 in the interdigital transducer 30. However, in the present case, this would be very difficult to realize as this would require a pitch P2 of less than 0.3 µm.

Here an alternative approach is proposed, where the fingers 23 of the interdigital capacitor 2 each comprise a first metal layer 231 and a second metal layer 232. As described in connection with FIGS. 1 and 2, the widths of the fingers 23 in the region of the first metal layer 231 are smaller than in the region of the second metal layer 232. Due to this, the production of surface acoustic waves is suppressed. Therefore, the pitch P2 between adjacent fingers 23 can even be chosen to be larger than the pitch P3 between adjacent fingers 33, which makes the production much easier. The interdigital capacitor 2 is extremely robust and nearly insensitive to process variations. Moreover, due to the second metal layer 232, ohmic losses in the interdigital capacitor 2 are reduced, which further improves the quality factor Q of the interdigital capacitor 2.

In addition a suppression of surface acoustic waves is obtained in the case of FIG. 3 due to the fact that the fingers 23 of the interdigital capacitor 2 are rotated with respect to the fingers 33 of the interdigital transducer 3. Particularly, the fingers 23 of the interdigital capacitor 2 basically run parallel to the propagation direction of the acoustic waves produced in the SAW resonator 3.

It can also be seen from FIG. 3 that the fingers 33 of the interdigital transducer 30 only comprise the first metal layer 231 and are free of the second metal layer 232. However, the electrodes 21, 22, 31, 32 as well as the conductor tracks 4 each comprise both, the first metal layer 231 and the second metal layer 232. In these elements the first metal layer 231 and the second metal layer 232 can even have the same width. The second metal layer 232 of the conductor tracks 4 and of the electrodes 21, 22, 31, 32 can be produced at the same time as the second metal layer 232 of the fingers 23, for example in a common production step.

FIGS. 4A to 4C show comparative measurements of an ideal capacitor (dashed line), of an interdigital capacitor on a piezoelectric substrate with only a first metal layer (short dashed line) and an interdigital capacitor on a piezoelectric substrate according to the present invention with two metal layers (solid line).

In FIG. 4A measurements of the reflectivity are shown. The y-axis represents the reflectivity whereas the x-axis represents the frequency in GHz of the applied voltage.

In FIG. 4B the capacitance in pF is shown on the y-axis whereas the x-axis again represents the applied voltage frequency in GHz.

In FIG. 4C the y-axis shows the phase in degrees and the x-axis again shows the applied voltage frequency in GHz.

As can be seen from all three figures, the interdigital capacitor of the present invention behaves almost like an ideal capacitor over the full frequency range. The interdigital capacitor with only one metal layer, however, shows runaways at some frequencies.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

REFERENCE NUMBER LIST 1 piezoelectric substrate
2 interdigital capacitor
3 surface acoustic wave resonator
4 conductive track
5 input terminal
6 ground terminal
7 output terminal
8 ground terminal
21 first electrode of the interdigital capacitor
22 second electrode of the interdigital capacitor
23 finger of the interdigital capacitor
30 interdigital transducer
31 first electrode of the interdigital transducer
32 second electrode of the interdigital transducer
33 finger of the interdigital transducer
231 first metal layer
232 second metal layer
P2 pitch between the fingers 23
P3 pitch between the fingers 33
T1 thickness of the first metal layer
T2 thickness of the second metal layer
W1 widths of the first metal layer
W2 widths of the second metal layer

The invention claimed is:

1. An electronic component comprising:
a piezoelectric substrate; and
an interdigital capacitor on top of the piezoelectric substrate, wherein:
the interdigital capacitor comprises two electrodes, each electrode of the two electrodes comprising a plurality of fingers;
each finger of the plurality of fingers comprise an associated first metal layer;
at least some fingers of the plurality of fingers comprise an associated second metal layer on top of the associated first metal layer; and
for each finger of the plurality of fingers comprising the associated first metal layer and the associated second metal layer, a width of a finger in a region of the associated first metal layer is larger than a width of a finger in a region of the associated second metal layer,
wherein, in different fingers of the plurality of fingers, the associated second metal layer and the associated first metal layer are arranged differently with respect to each other.

2. The electronic component according to claim 1, wherein, for each finger of the plurality of fingers comprising the associated first metal layer and the associated second metal layer, a thickness of the associated first metal layer is smaller than a thickness of the associated second metal layer.

3. The electronic component according to claim 1, wherein, for each finger of the plurality of fingers comprising the associated first metal layer and the associated second metal layer, the associated second metal layer and the associated first metal layer are arranged identically with respect to each other.

4. The electronic component according to claim 1, wherein:
the electronic component further comprises a surface-acoustic-wave resonator with an interdigital transducer, wherein the interdigital transducer comprises two electrodes, each electrode of the two electrodes including a plurality of fingers;
the interdigital transducer is arranged on top of the piezoelectric substrate; and
the interdigital transducer is electrically connected to the interdigital capacitor.

5. The electronic component according to claim 4, wherein a pitch between two adjacent fingers of the interdigital capacitor is larger than a pitch between two adjacent fingers of the interdigital transducer.

6. The electronic component according to claim 4, wherein a width of the plurality of fingers of the interdigital capacitor is at least as large as a width of the plurality of fingers of the interdigital transducer.

7. The electronic component according to claim 4, wherein the plurality of fingers of the interdigital capacitor run transversely to the plurality of fingers of the interdigital transducer.

8. The electronic component according to claim 4, wherein the surface-acoustic-wave resonator has a resonance frequency of at least 3 gigahertz (GHz).

9. The electronic component according to claim 4, wherein the plurality of fingers of the interdigital transducer have a same thickness as the associated first metal layer.

10. The electronic component according to claim 1, wherein a capacitance of the interdigital capacitor is less than or equal to 2 pF.

11. The electronic component according to claim 1, wherein the electronic component is a surface-acoustic-wave filter.

12. A device comprising:
a piezoelectric substrate; and
an interdigital capacitor comprising a first electrode finger and a second electrode finger, each of the first electrode finger and the second electrode finger comprising:
a first metal layer formed on a top surface of the piezoelectric substrate; and
a second metal layer formed on a top surface of the first metal layer such that the first metal layer is between the piezoelectric substrate and the second metal layer;
wherein a width of the first electrode finger in the second metal layer is less than a width of the first electrode finger in the first metal layer, and
wherein a pitch of the first metal layer is periodic, and a pitch of the second metal layer is aperiodic.

13. The device of claim 12, wherein the width of the first electrode finger in the second metal layer is less than 50% of the width of the first electrode finger in the first metal layer.

14. The device of claim 12, wherein the width of the first electrode finger in the second metal layer is between 10% and 80% of the width of the first electrode finger in the first metal layer.

* * * * *